US010255402B1

(12) United States Patent
Rossman et al.

(10) Patent No.: US 10,255,402 B1
(45) Date of Patent: Apr. 9, 2019

(54) SYSTEM AND METHOD FOR INSTANCE SNAPPING

(71) Applicant: Cadence Design Systems, Inc., San Jose, CA (US)

(72) Inventors: Sabra Rossman, Bellevue, WA (US); Karun Sharma, Fremont, CA (US); Juno Lin, Saratoga, CA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 108 days.

(21) Appl. No.: 15/277,514

(22) Filed: Sep. 27, 2016

(51) Int. Cl.
*G06F 17/50* (2006.01)
(52) U.S. Cl.
CPC .............. *G06F 17/5072* (2013.01)
(58) Field of Classification Search
CPC .................................... G06F 17/5072
See application file for complete search history.

(56) References Cited

U.S. PATENT DOCUMENTS

| 7,100,128 | B1 | 8/2006 | Nequist et al. |
| 8,473,874 | B1 | 6/2013 | Sharma et al. |
| 8,539,416 | B1 | 9/2013 | Rossman et al. |
| 8,631,363 | B2 | 1/2014 | Nequist |
| 8,984,465 | B1 | 3/2015 | Salowe |
| 9,003,349 | B1 | 4/2015 | Salowe |
| 9,104,830 | B1 | 8/2015 | Salowe et al. |
| 9,117,052 | B1 | 8/2015 | Salowe et al. |
| 2012/0124536 | A1 | 5/2012 | Sharma |
| 2017/0124242 | A1* | 5/2017 | Sharma ............... G06F 17/5068 |

* cited by examiner

*Primary Examiner* — Vuthe Siek
(74) *Attorney, Agent, or Firm* — Foley & Lardner LLP

(57) ABSTRACT

Embodiments according to the present disclosure relate to physically implementing an integrated circuit design while conforming to the requirements of complex color based track systems. In embodiments, the color based track systems can include irregularly spaced and non-uniform width colored tracks. These and other embodiments include a methodology to snap instances to a set of such tracks such that all pins/shapes in the instance result in valid locations. In some embodiments, the methodology further includes creating a geometric representation of the tracks to assist in the quick identification of matching tracks.

20 Claims, 8 Drawing Sheets

SYSTEM AND METHOD FOR INSTANCE SNAPPING

TECHNICAL FIELD

The present disclosure relates to integrated circuits, and more particularly to methods and apparatuses for implementing designs of integrated circuits in processes that include coloring for multiple patterning and track based systems.

BACKGROUND

Electronic design automation (EDA) tools are used to design integrated circuits. Integrated circuits can include many thousands and perhaps millions of circuit elements (e.g, transistors, logic gates, diodes, etc.) and interconnecting wires and busses. The circuit elements and wires can be formed on many different layers, with various interconnections (e.g, vias) between layers. EDA tools allow a designer to describe an integrated circuit based on its desired behavior, and then transform that behavioral description into a set of geometric shapes called a layout which forms the circuit elements and wires for all the different layers.

EDA tools further allow certain components to be specified at a high level of abstraction and then replicated many times in the overall integrated circuit, each being called an "instance," at lower levels of abstraction and placed on different layers of the integrated circuit. Any given instance can include dozens or more geometric shapes, and some shapes in the same instance can be placed in different layers, for example to allow for shapes to be aligned with different tracks or other specified directions associated with different layers. Instances can also include "pins," which are elements that allow the instance to be connected with other components via wires and busses for example.

As integrated circuit feature sizes continually get smaller and smaller (e.g, 10 nm and below), EDA tools need to be aware of an ever-increasing number of constraints to ensure that instances are placed correctly for a target fabrication process. Current approaches are unsatisfactory, for example only checking a single track or shape in an instance against the constraints, without consideration for other shapes in the instance.

SUMMARY

Embodiments according to the present disclosure relate to physically implementing an integrated circuit design while conforming to the requirements of complex color based track systems. In embodiments, the color based track systems can include irregularly spaced and non-uniform width colored tracks. These and other embodiments include a methodology to snap instances to a set of such tracks such that all pins/shapes in the instance result in valid locations. In some embodiments, the methodology further includes creating a geometric representation of the tracks to assist in the quick identification of matching tracks.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION OF THE PREFERRED EMBODIMENTS

Figure 1:
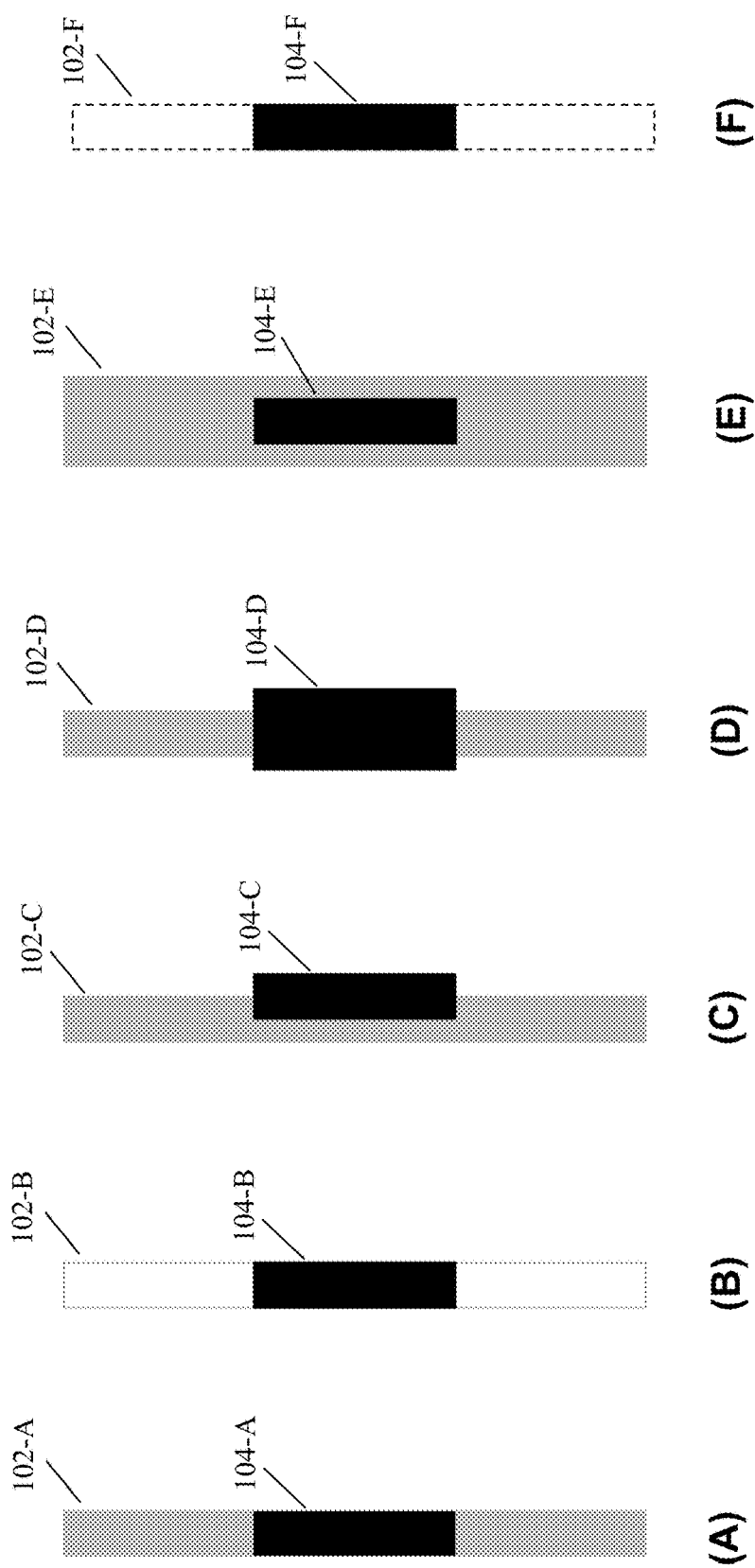
FIGS. 1(A) to 1(F) are diagrams illustrating example aspects of checking placement of shapes in a color based track system where shapes also have assigned colors.
Figure 2:
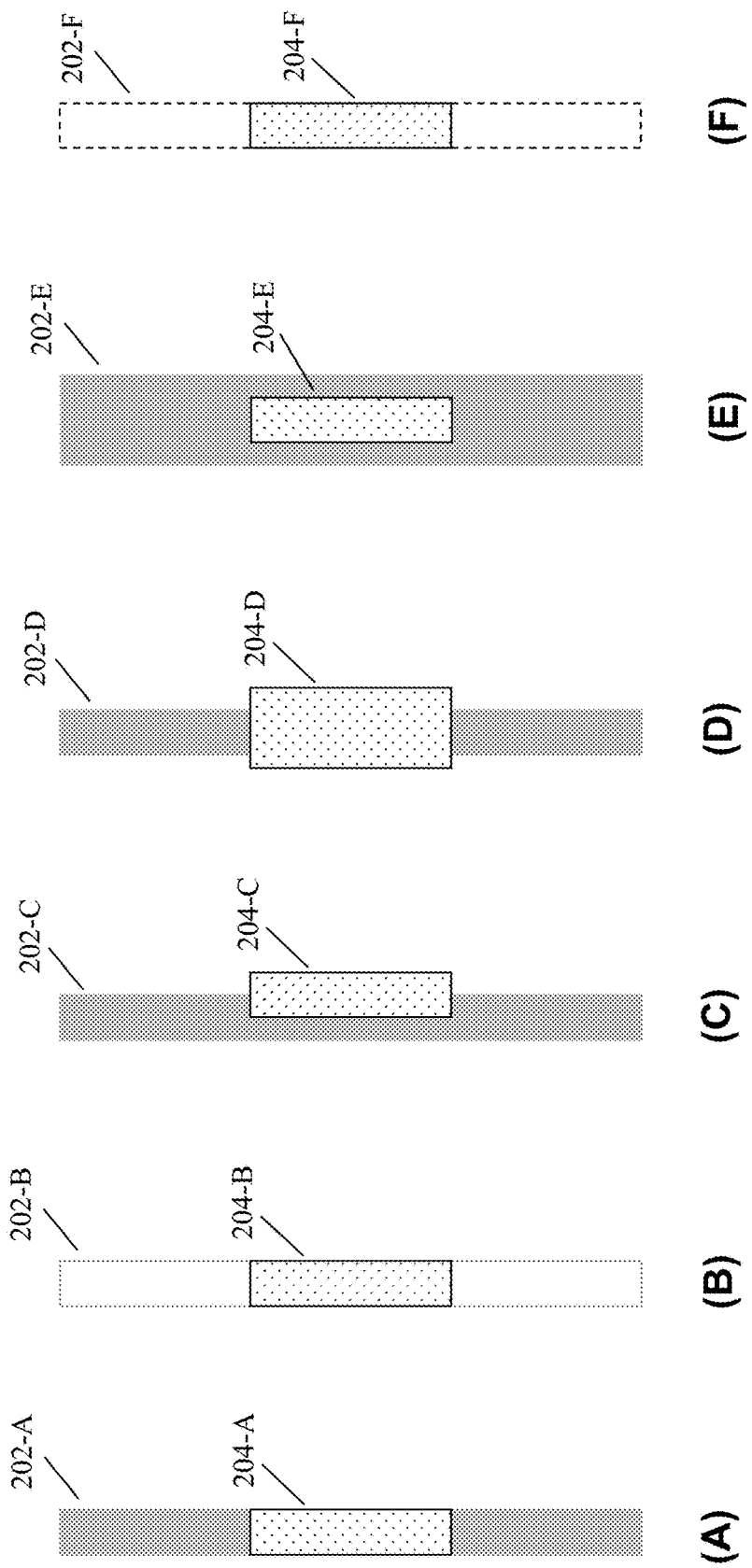
FIGS. 2(A) to 2(F) are diagrams illustrating example aspects of checking placement of shapes in a color based track system where shapes do not have assigned colors.

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

According to certain general aspects, the present embodiments relate to physically implementing integrated circuit designs such that they conform to complex constraints imposed by fabrication processes of nodes of 10 nm and below. According to certain additional aspects, the present embodiments relate to providing EDA tools that are aware of these constraints and are adapted to implement designs that conform with them.

For example, some fabrication processes require all circuit elements to be located in tracks having specified widths and that are separated by specified gaps. These tracks are generally specified to run in a single direction on a given layer or designated portion or region of a layer of the integrated circuit. For example, the tracks on one layer may be specified to run in a vertical or north-south direction, while the tracks on an adjacent layer may be specified to run in a horizontal or east-west direction. The process by which EDA tools place an instance such that all of its associated shapes are correctly located with respect to tracks in such fabrication processes is sometimes referred to as "snapping" the instance.

In some fabrication processes, the tracks are specified to have uniform widths and uniform spacing. However, at process nodes of 10 nm and below, integrated circuit designs may need to conform to complex track systems called width spacing patterns ("WSPs"). In systems including WSPs, the track patterns can be specified such that they do not have uniform width or spacing. As such, EDA tools (e.g, layout and verification tools) must be adapted to be "WSP aware." In particular, placer tools need to be able to snap instances to not just one track, but a set of multiple tracks such that all pins/shapes in the instance result in valid locations.

Another constraint of which EDA tools need to be aware are those imposed by multiple patterning processes, of which double patterning (DP) is a common example. These processes separate a layout into two or more patterns, which are then separately imaged onto the same layer of the integrated circuit using separate masks. The process of separating a layout into two or more patterns is called "coloring." In the coloring process, each shape in the design is assigned to one of the multiple patterns or is figuratively "colored" with a color respectively associated with the assigned pattern. In other words, all shapes assigned to the same pattern in a given layer share the same color.

Some integrated circuit processes include both track and coloring constraints. In such cases, not only are shapes assigned to specified patterns or associated colors, tracks are also assigned to specified patterns or associated colors. Typically, for a double patterning process, adjacent tracks are assigned to alternating colors, with similar types of assignment schemes for higher order patterning processes.

FIGS. 1(A) to 1(F) illustrate example aspects of implementing an integrated circuit design in a process where tracks and shapes both have assigned colors. In particular, in these examples, all of shapes 104-A, 104-B, 104-C, 104-D, 104-E and 104-F have been assigned a "dark" color for a two-color double patterning process. For ease of illustration, only one shape and one track are shown in these examples. However, it should be appreciated that a design will include many thousands of shapes and tracks on many different layers.

In FIG. 1(A), the "dark" color and width of shape 104-A correctly matches the "dark" color and width of track 102-A. As can be seen, shape 104-A is also correctly aligned with track 102-A so an instance having shape 104-A placed as in FIG. 1(A) would be considered to be correctly snapped.

In FIG. 1(B), the "dark" color of shape 104-B does not match the "light" color of track 102-B. Accordingly, even though the width of shape 104-B matches the width of track 102-B, and the shape 104-B is correctly aligned with track 102-B, so an instance having shape 104-B placed as in FIG. 1(B) would not be considered to be correctly snapped.

In FIG. 1(C), the "dark" color of shape 104-C correctly matches the "dark" color of track 102-C, but shape 104-C is not aligned correctly on track 102-C. Accordingly, even though the width of shape 104-C also matches the width of track 102-C, an instance having shape 104-C placed as in FIG. 1(C) would not be considered to be correctly snapped.

In FIG. 1(D), the "dark" color of shape 104-D correctly matches the "dark" color of track 102-B, but the width of shape 104-D does not match the width of track 102-D. Accordingly, even though shape 104-D could be considered to be aligned with track 102-D, an instance having shape 104-D placed as in FIG. 1(D) would not be considered to be correctly snapped.

In FIG. 1(E), the "dark" color of shape 104-E correctly matches the "dark" color of track 102-E, but the width of shape 104-E does not match the width of track 102-E. Accordingly, even though shape 104-E could be considered to be aligned with track 102-E, an instance having shape 104-E placed as in FIG. 1(E) would not be considered to be correctly snapped.

FIG. 1(F) illustrates an example where the color of shape 104-F is immaterial in the verification process, and so an instance having shape 104-F placed as shown in FIG. 1(F) would be considered to be correctly snapped. This can happen, for example, when track 102-F does not have an assigned color and/or the colors of tracks and/or shapes are assigned in a subsequent process. Alternatively, FIG. 1(F) can illustrate an example where a layer or portion thereof in which shape 104-F is placed does not actually have any tracks.

FIGS. 2(A) to 2(F) illustrate example aspects of implementing an integrated circuit design in a process where tracks have assigned colors (e.g, either a "light" or "dark" color for a two-color double patterning process), but the shapes do not and/or when the colors of the shapes are inferred from the colors of the tracks. In such a case, the verification process does not need to determine whether the shapes match the colors of the tracks.

In FIG. 2(A), the width of shape 204-A correctly matches the width of track 202-A and shape 204-A is also correctly aligned with track 202-A. Accordingly, an instance having shape 204-A placed as in FIG. 2(A) would be considered to be correctly snapped.

In FIG. 2(B), the width of shape 204-B matches the width of track 202-B, and the shape 204-B is correctly aligned with track 202-B, so an instance having shape 204-B placed as in FIG. 2(B) would be considered to be correctly snapped.

In FIG. 2(C), shape 204-C is not aligned correctly on track 202-C. Accordingly, even though the width of shape 204-C matches the width of track 202-C, an instance having shape 204-C placed as in FIG. 2(C) would not be considered to be correctly snapped.

In FIG. 2(D), the width of shape 204-D does not match the width of track 202-D. Accordingly, even though shape 204-D could be considered to be aligned with track 202-D, an instance having shape 204-D placed as in FIG. 2(D) would not be considered to be correctly snapped.

In FIG. 2(E), the width of shape 204-E does not match the width of track 202-E. Accordingly, even though shape 204-E could be considered to be aligned with track 202-E, an instance having shape 204-E placed as in FIG. 2(E) would not be considered to be correctly snapped.

FIG. 2(F) illustrates an example where an instance having shape 204-F is considered to be correctly snapped, regardless of track 202-F. This can happen in cases as described above in connection with FIG. 1(F).

Figure 3A:
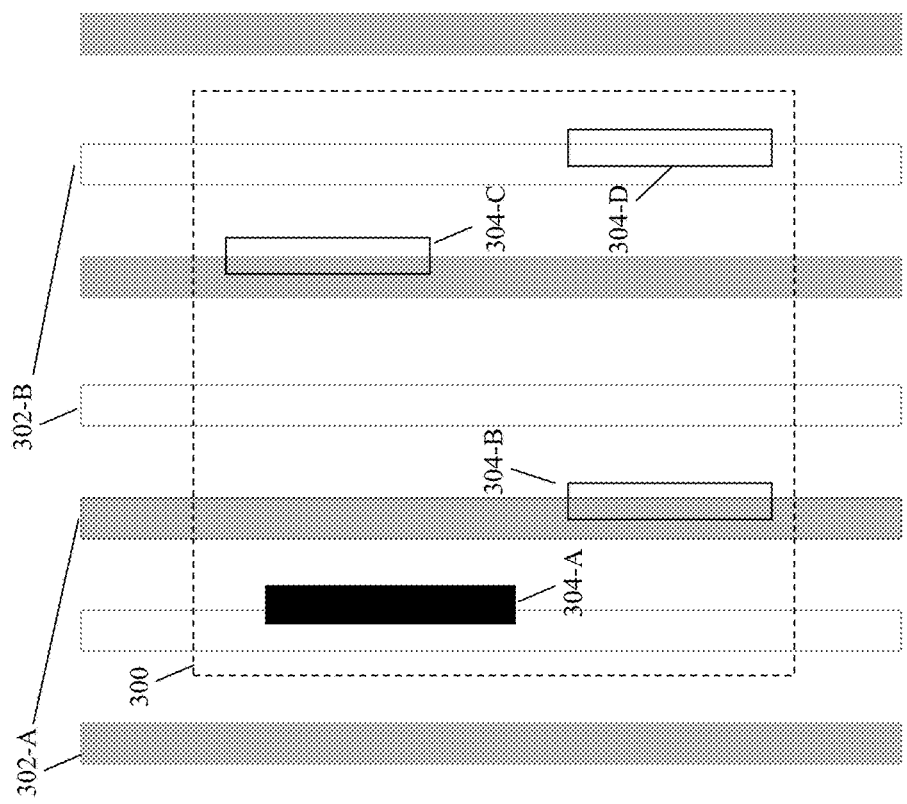
FIGS. 3(A) and 3(B) are diagrams illustrating example aspects of a conventional process for snapping an instance in a color based track system.
Figure 3B:
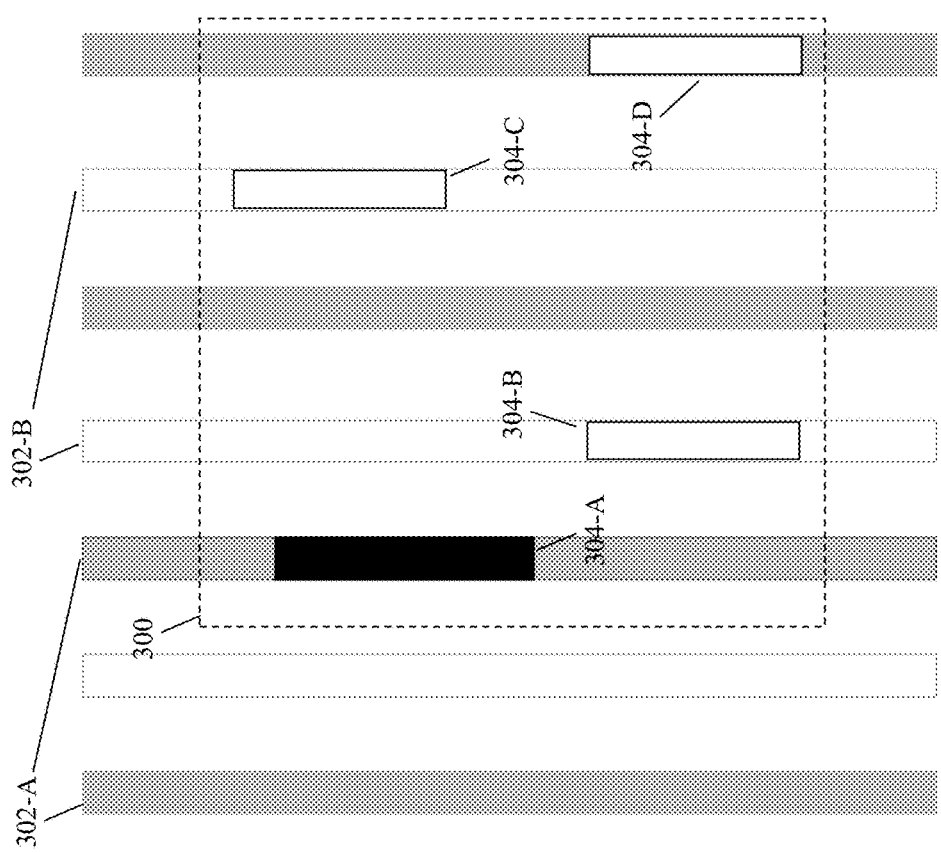

FIGS. 3(A) and 3(B) illustrate aspects of a conventional methodology for attempting to snap an instance in a color-based track system that is used in existing EDA tools.

In FIG. 3(A), instance 300 includes shapes 304-A, 304-B, 304-C and 304-D in a layer. Shape 304-A has been assigned a "dark" color for a double patterning process, whereas the other shapes 304-B, 304-C and 304-D have been assigned a "light" color. Meanwhile, alternating tracks 302-A have been assigned a "dark" color, while tracks 302-B have been assigned a "light" color. As can be seen in FIG. 3(A), after an initial placement of instance 300, all shapes 304 are unaligned with tracks 302.

In FIG. 3(B), the instance has been shifted to the right in a conventional snapping process. More particularly, in a conventional process, shape 304-A is selected and the nearest track with a matching color (e.g, the "dark" color track 302-A to the right) is identified. Then, the entire instance 300 is shifted by the distance necessary to snap shape 304-A to the nearest matching track 302-A. As can be seen in FIG. 3(B), in this approach, shapes 304-A, 304-B and 304-C successfully end up on track, but "light" colored shape 304-D is aligned with a non-matching "dark" color track 302-A.

Accordingly, the present applicants recognize that a method is needed to better identify a correct snapping adjustment for an instance. In view of the foregoing, an aspect of the present embodiments is to provide a method of implementing an integrated circuit design such that all of the shapes in an instance conform to color-based tracks. According to certain additional aspects, the present embodiments are adapted to implement an integrated circuit design in fabrication processes including WSPs, or where the tracks and shapes do not have uniform widths and spacing as in the above example.

Figure 4A:
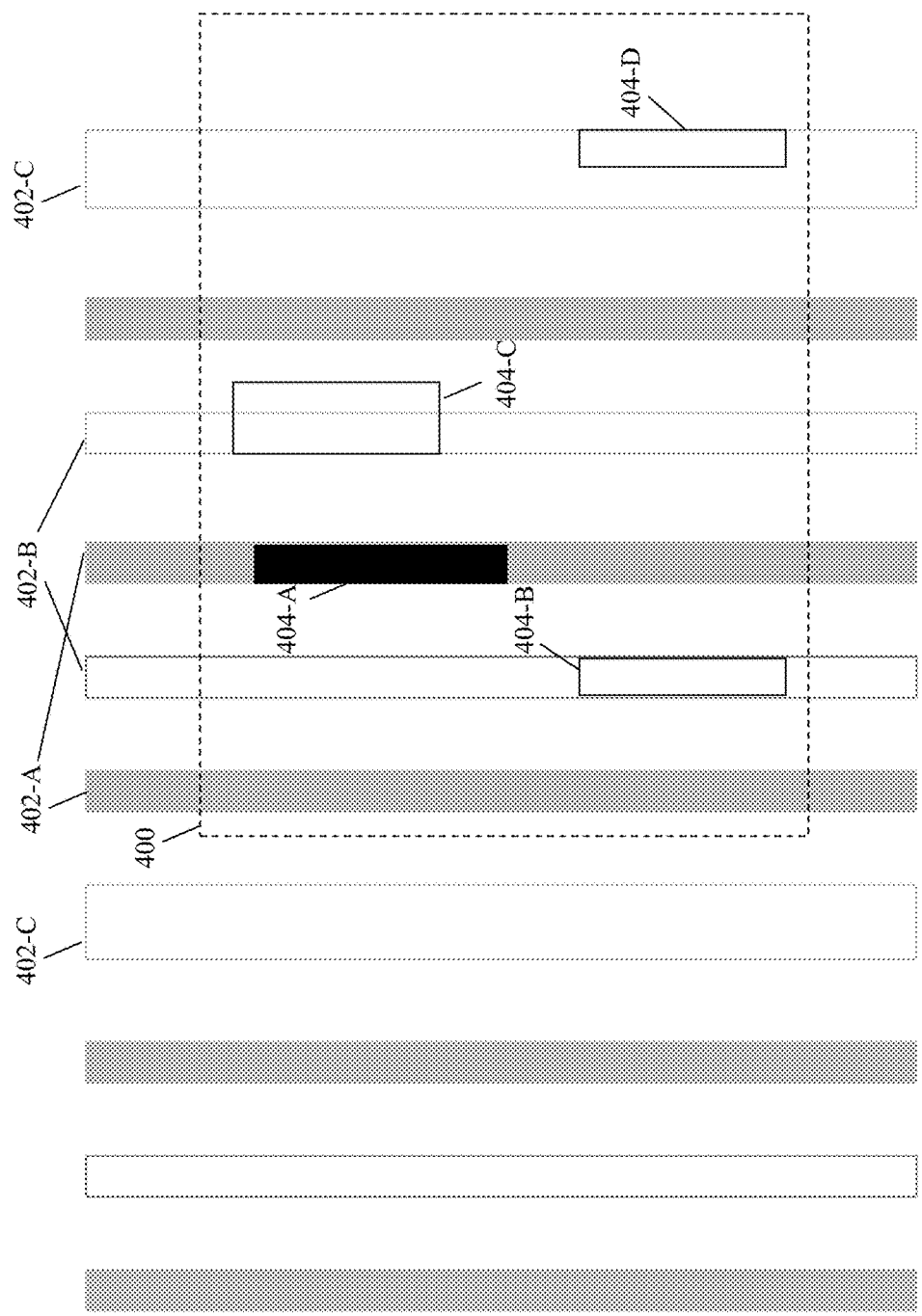
FIGS. 4(A) and 4(B) are diagrams illustrating example aspects of a process for snapping an instance in a color based track system according to the present embodiments.
Figure 4B:
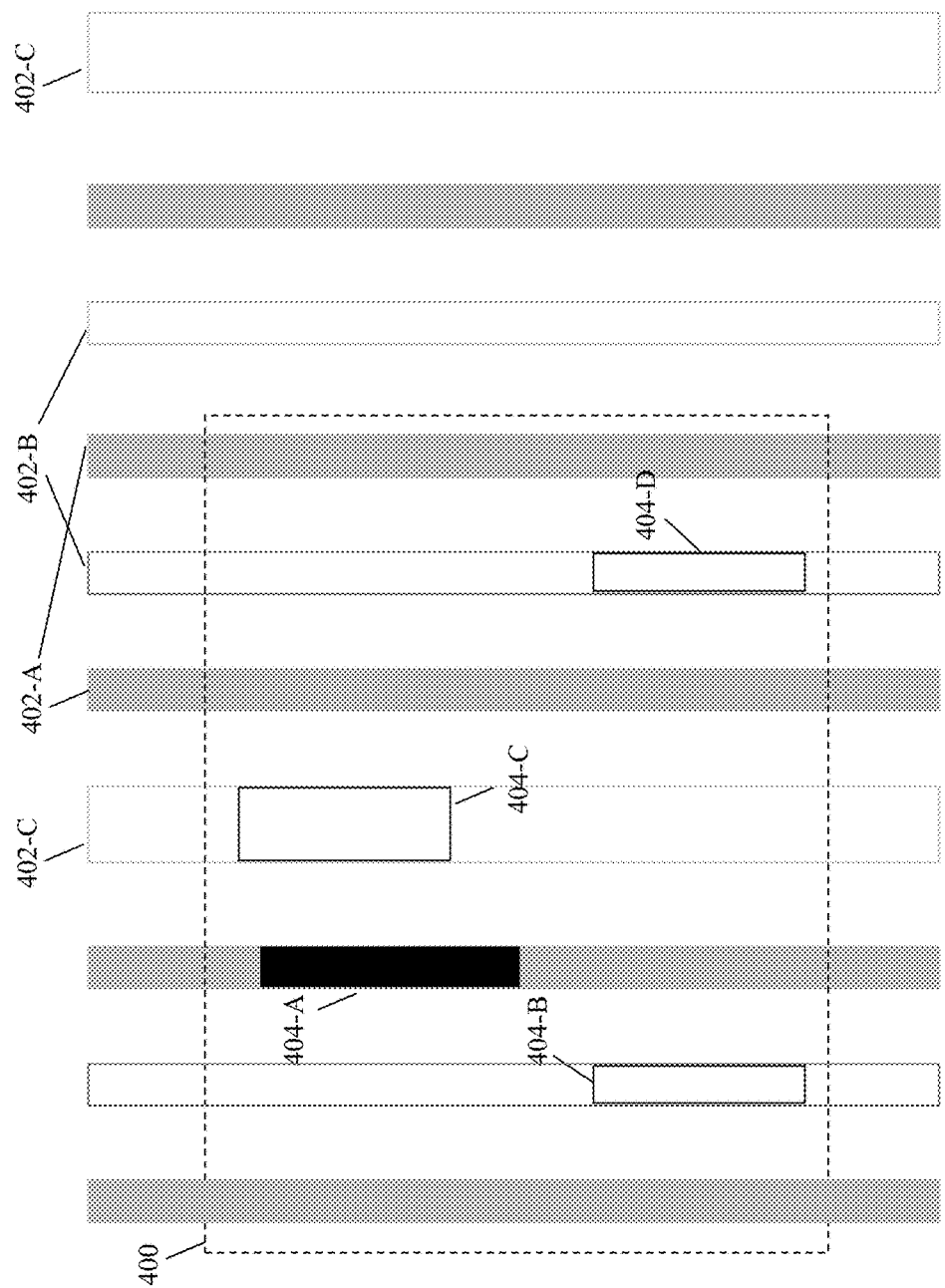

FIGS. 4(A) and 4(B) illustrate aspects of an example methodology for snapping an instance in color based track systems having WSPs according to the present embodiments.

In this example, instance 400 has a "dark" color shape 404-A and "light" color shapes 404-B, 404-C and 404-D for a double patterning process. This example also includes color-based track patterns including "dark" color tracks 402-A and "light" color tracks 402-B and 402-C. To illustrate WSP-aware aspects of the present embodiments, "light" color tracks 402-C have a different width than "light" color tracks 402-B as well as "dark" color tracks 402-A.

In the example shown in FIG. 4(A), instance 400 (perhaps after an initial manual or automatic placement) is considered to be not correctly snapped. More particularly, although shapes 404-A and 404-B have color and width matches and correctly aligned with tracks 402-A and 402-B, respectively, shapes 404-C and 404-D have width violations with respect to tracks 402-B and 402-C, respectively.

As set forth in more detail below, the present applicants have recognized that the widest pin or shape in most designs will be the hardest to match to a track in a color-based track system such as those including WSPs. According to an example methodology of the present embodiments, therefore, the largest shape 404-C in the instance 400 is identified, and the entire instance is moved to the left to find a track that does not result in any color and width (and perhaps other) violations for that shape 404-C. This is shown in FIG. 4(B). After shape 404-C has been found to be correctly placed, the remaining shapes 404-A, 404-B and 404-D are checked, and in the example of FIG. 4(B), no violations are found.

Figure 5:
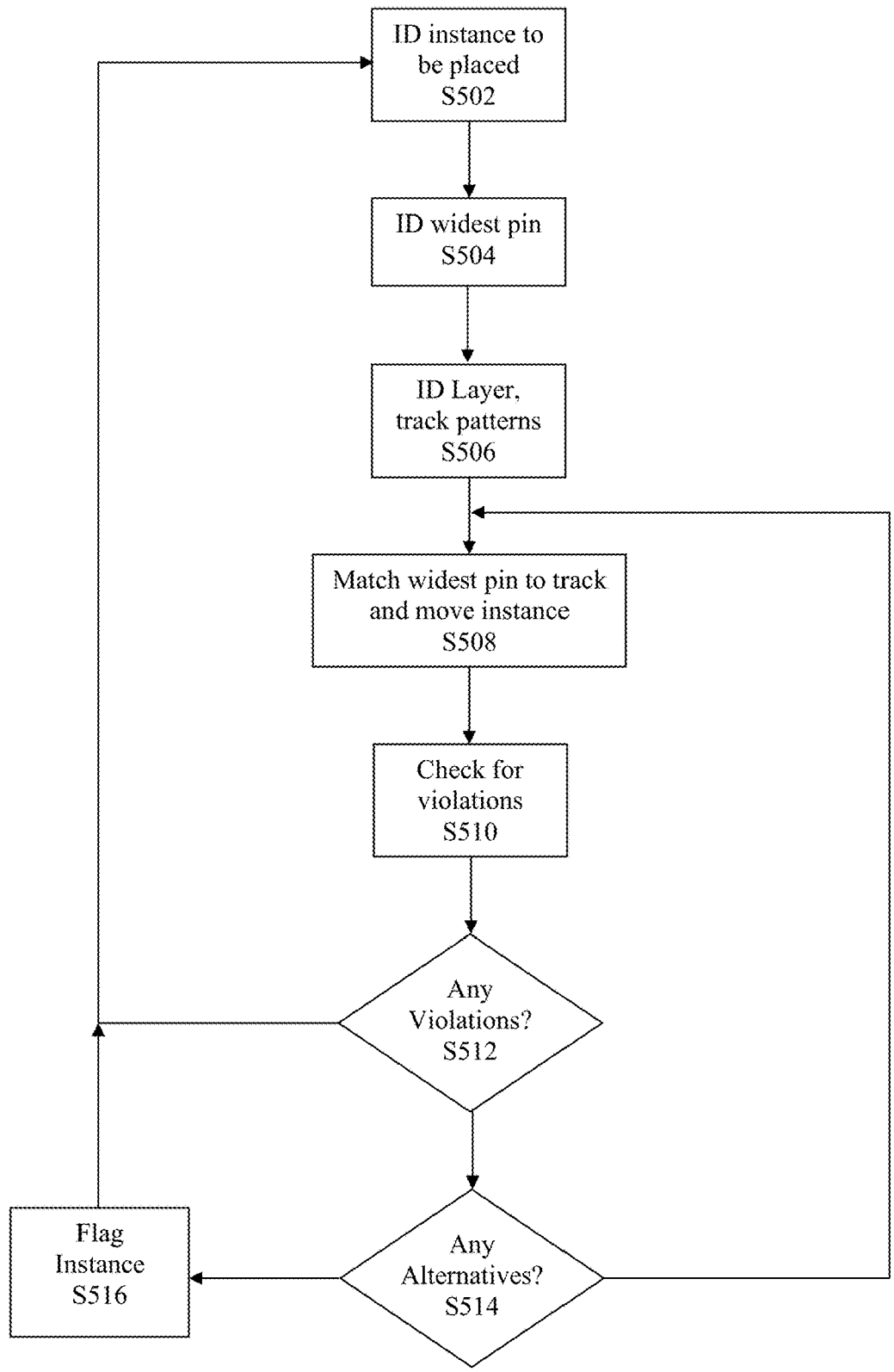
FIG. 5 is a flowchart illustrating an example process for snapping an instance in a color based track system according to the present embodiments.

FIG. 5 is a flowchart illustrating further aspects of an example methodology for implementing an integrated circuit design in color-based WSP systems according to the present embodiments.

In step S502 an instance to be placed is identified. For example, embodiments in accordance with the present disclosure can be included in a placer tool that uses algorithms to parse through all the component instances in a design and automatically determine a physical location for each instance within the integrated circuit, or other similar interactive placement tools such as layout editors and the like.

Data for the instance to be placed is accessed (e.g, GDS II data), and can include an identification of all the shapes in the instance, and their geometrical dimensions (e.g, width) and relationships. Data can also include a color assigned to each of the shapes for a multiple patterning process, and/or an indication that no color is assigned. In embodiments, additional data for each shape is also accessed, and can include attribute information such as a wire type (e.g, power/ground, etc.).

In a next step S504, the widest shape in the instance is identified. As set forth above, the present applicants recognize that the widest pin in most instances will be the hardest to match, so this shape or whatever other shape is the widest in the instance is identified.

In step S506, the layer in which the widest pin in the instance to be placed is identified. For example, the instance may include shapes that occupy two or more adjacent layers in the integrated circuit and are connected together by vias. In these examples, the layer into which the widest pin in the instance is to be placed is selected as the snapping target.

Also in step S506, the set of track patterns for this layer are identified. For example, data associated with the target process for this design can include information about the tracks for each layer, along with their locations (e.g, starting location for each track pattern), widths and spacing. Additional data accessed for the set of tracks for the target layer includes the colors assigned to each track for a multiple patterning process.

According to certain aspects, in the present embodiments, based on the above information for the tracks for the target layer, geometric representations for all of the track patterns in the target layer are created. In one example, the geometric representations are zonetree representations such as those described in U.S. Pat. No. 7,100,128, the contents of which are incorporated herein by reference in their entirety. Those skilled in the art will understand how to form zonetree representations of track patterns using the information described above based on the incorporated patent, and so further details thereof will be omitted here for sake of clarity of the invention.

In a next step S508, the instance will first be snapped such that the widest pin in the instance is on a WSP correct track. For example, a snapping direction is chosen and the closest track that matches the width and color of the widest pin is identified. In embodiments where zonetree representations of the track patterns have been created, this includes using the zonetree lookup structure to search a small region in a specific direction of the target pin (e.g, for vertical tracks, the direction would be to the left or right). The search will produce the track shapes in that region. Each of the track shapes can be examined to determine which (if any) match the desired width and color. Of these, the track closest to the target pin is identified. If a match is found, all the shapes in the instance are moved by the same amount in the snapping direction as is needed to properly align the widest pin with the identified track.

In step S510 all of the other shapes in the instance are examined for any violations. This can include checking all the shapes for color, width and/or alignment violations described above in connection with FIGS. 1 and 2. This can also include checking all the shapes for various other types of violations as may be desired for a particular design or designer. For example, certain or all of the tracks in a layer and shapes in an instance may be specified to have additional attributes besides color and width. Such attributes can include user defined attributes such as wire type (e.g, power/ground bus, etc. or other mechanism for causing certain wires to be assigned to certain layers or tracks). In such example embodiments, step S510 can further include comparing shapes and tracks with these additional attributes.

In step S512 it is determined whether any violations were discovered in step S510. If not, the instance is considered correctly snapped, and processing returns to step S502. Otherwise (and/or if no match was found in step S508), processing proceeds to step S514, where it is determined whether it is possible to try and match the widest pin to a different track. For example, the search region can be shifted farther in the same search direction as in step S508 and the same examination is performed. This process of shifting the search region is limited by the period of the pattern (e.g., the total search distance shifted cannot exceed the period of the WSP pattern). If the search region can be shifted farther, processing returns to step S508. Otherwise, the instance is flagged as being not fully snapped in step S516 and then processing returns to step S502. In these and other embodiments, even if the instance cannot be correctly snapped, the process can return the snapping location that will result in the fewest number of violations.

It should be noted that in some embodiments, an instance is considered correctly snapped if there are no or a fewest number of violations for shapes of the instance only in the target layer. However, in other embodiments, further checking is performed for shapes of the instance that are located in other layers besides the target layer, and the instance is considered correctly snapped if there are no or a fewest number of violations for shapes of the instance in two or more layers.

Figure 6:
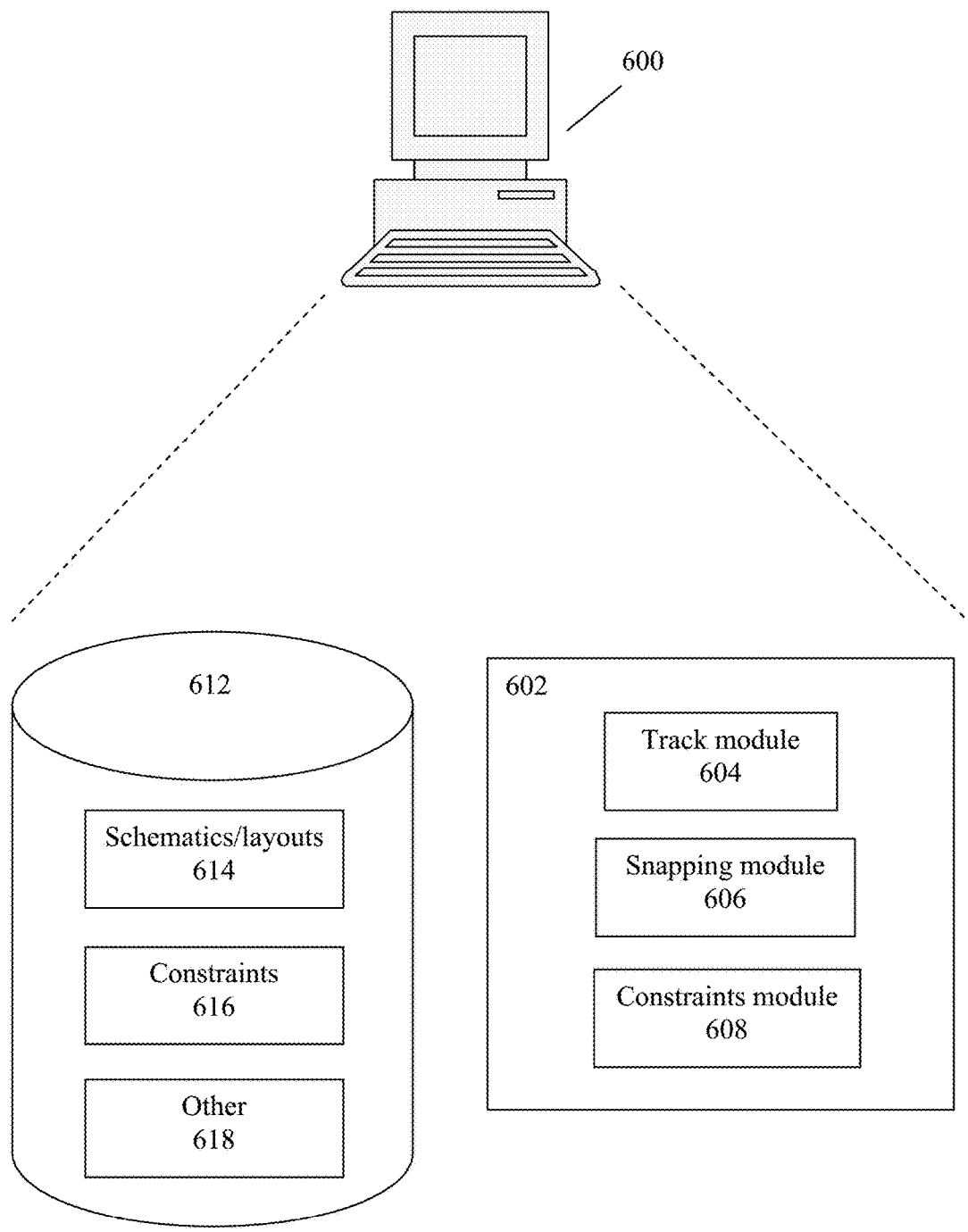
FIG. 6 is a functional block diagram illustrating an example system for snapping an instance in a color based track system according to the present embodiments.

FIG. 6 is a functional block diagram of an example system for color and WSP aware instance snapping according to the present embodiments.

In embodiments, the system 600 can be one or more general purpose computers that are loaded with software (e.g., EDA tools) and/or customized to include hardware for interactively implementing physical electronic designs. In some embodiments, the one or more computing systems 600 comprise various components not shown such as processor(s) or processor core(s), memory, disks, etc. The software and/or custom hardware may include interactive or automated modules such as a placer, a routing engine, a layout editor, a design rule checker, a verification engine, or a floorplanner, etc. as will be appreciated by those skilled in the art. The one or more computing systems 600 may further write to and read from a local or remote volatile or non-volatile computer accessible storage 612 that stores thereon data or information such as, but not limited to, one or more databases such as schematic design database(s) or physical design database(s) 614, libraries, data, rule decks, constraints (e.g., track specifications), etc. 616, and/or other information or data 618 (e.g., coloring data) that may be required to support the methodology of the present embodiments. In some embodiments, the one or more computing systems are implemented in a "cloud" configuration and/or a client/server configuration. For example, one or more server computers may be loaded with application software (e.g., a layout editor tool) for implementing some or all of the methodology of the present embodiments, and one or more client computers can communicate with the server computer(s) via a network to perform some or all of the methodology of the embodiments for a particular design.

In some embodiments, the one or more computing systems 600 may, by various standalone software, hardware modules or combinations thereof 602 (e.g., EDA tool), include a track pattern or track pattern group module 604 to identify and create geometric representations of track patterns for performing WSP aware snapping of instances according to the present embodiments, a snapping module 606 to identify instances and associated shapes and, either alone or jointly with one or more other modules, identify potential snapping locations for instances, and one or more modules 608 to perform constraint (e.g., color, width, alignment, etc.) violation analysis. Additionally or alternatively, any or all of modules 604, 606 and 608 may be implemented by adapting certain pre-existing modules (e.g., placer, layout editor, etc.) with additional functionality as may be required to implement a WSP-aware environment to physically implement electronic designs according to the present embodiments and as described above. Those skilled in the art will be able to understand how to implement various examples of such modules after being taught by the present disclosure.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A method for physically implementing a design for an integrated circuit, comprising:
   identifying a set of tracks in a layer of a plurality of layers of the integrated circuit; and
   identifying an instance of an electronic component of the design of the integrated circuit, the instance comprising a plurality of shapes; and
   snapping the instance to the set of tracks by causing the design of the integrated circuit to be updated such that certain of the plurality of shapes in the instance are placed in valid locations in the layer of the integrated circuit with respect to requirements associated with the set of tracks, wherein the requirements are further associated with causing the design of the integrated circuit to be fabricated in a target fabrication process.

2. A method according to claim 1, further comprising creating a geometric representation of the set of tracks.

3. A method according to claim 2, wherein snapping includes using the geometric representation to identify a matching track in the set of tracks for one of the plurality of shapes with respect to the requirements.

4. A method according to claim 1, wherein snapping includes:
   identifying a widest one of the plurality of shapes; and
   identifying a matching track in the set of tracks for the widest one of the plurality of shapes with respect to the requirements.

5. A method according to claim 1, wherein the requirements include an assigned color for one or more of the set of tracks, the assigned color corresponding to a pattern in a multiple patterning process for the integrated circuit, wherein snapping includes matching the assigned color for one of the set of tracks to a color attribute of one of the plurality of shapes of the instance that is placed on the one track.

6. A method according to claim 1, wherein the requirements include a specified width for one or more of the set of tracks, wherein snapping includes matching the specified width for one of the set of tracks to a width of one of the plurality of shapes of the instance that is placed on the one track.

7. A method according to claim 1, wherein the requirements include a specified width and spacing for one or more of the set of tracks, wherein snapping includes matching the specified width and spacing for one of the set of tracks to a width and location of one of the plurality of shapes of the instance that is placed on the one track.

8. A method according to claim 7, wherein the specified width for the one track is different than the specified width for another one of the set of tracks.

9. A method according to claim 7, wherein the specified spacing for the one track is different than the specified spacing for another one of the set of tracks.

10. A method according to claim 1, wherein the certain shapes are all of the shapes of the instance in the layer.

11. A method according to claim 1, wherein the certain shapes are a maximum number of the shapes of the instance in the layer for all possible snapping locations.

12. A method according to claim 1, wherein the instance is at one level of hierarchy associated with the instance in the design, and wherein the plurality of shapes are configured for the one level of hierarchy.

13. A non-transitory computer readable storage medium having instructions stored thereon which, when executed by a computer, cause the computer to execute a method for physically implementing a design for an integrated circuit, the method comprising:
    identifying a set of tracks in a layer of a plurality of layers of the integrated circuit; and
    identifying an instance of an electronic component of the design of the integrated circuit, the instance comprising a plurality of shapes; and
    snapping the instance to the set of tracks by causing an electronic file containing the design of the integrated circuit to be updated such that the design specifies that certain of the plurality of shapes in the instance are placed in valid locations in the layer of the integrated circuit with respect to requirements associated with the set of tracks, wherein the electronic file is configured for causing the design of the integrated circuit to be fabricated in a target fabrication process.

14. The computer readable storage medium according to claim 13, the method further comprising creating a geometric representation of the set of tracks, and wherein snapping includes using the geometric representation to identify a matching track in the set of tracks for one of the plurality of shapes with respect to the requirements.

15. The computer readable storage medium according to claim 13, wherein snapping includes:
    identifying a widest one of the plurality of shapes; and
    identifying a matching track in the set of tracks for the widest one of the plurality of shapes with respect to the requirements.

16. The computer readable storage medium according to claim 13, wherein the requirements include an assigned color for one or more of the set of tracks, the assigned color corresponding to a pattern in a multiple patterning process for the integrated circuit, wherein snapping includes matching the assigned color for one of the set of tracks to a color attribute of one of the plurality of shapes of the instance that is placed on the one track.

17. The computer readable storage medium according to claim 13, wherein the requirements include a specified width for one or more of the set of tracks, wherein snapping includes matching the specified width for one of the set of tracks to a width of one of the plurality of shapes of the instance that is placed on the one track.

18. The computer readable storage medium according to claim 13, wherein the requirements include a specified width and spacing for one or more of the set of tracks, wherein snapping includes matching the specified width and spacing for one of the set of tracks to a width and location of one of the plurality of shapes of the instance that is placed on the one track, and wherein the specified width for the one track is different than the specified width for another one of the set of tracks, and wherein the specified spacing for the one track is different than the specified spacing for another one of the set of tracks.

19. A system for physically implementing a design for an integrated circuit, comprising:
    one or more interactive modules for allowing a user to identify an electronic component of the design and a layer of a plurality of layers of the integrated circuit, the one or more interactive module further identifying an instance of the electronic component, the instance comprising a plurality of shapes;
    a track module that, in response to the user identifying the layer of the integrated circuit, identifies a set of tracks in a layer of the integrated circuit; and
    a snapping module that communicates with the track module and snaps the instance to the set of tracks by causing the design of the integrated circuit to be updated such that certain of the plurality of shapes in the instance are placed in valid locations in the layer of the integrated circuit with respect to requirements associated with the set of tracks, wherein the requirements are further associated with causing the design of the integrated circuit to be fabricated in a target fabrication process.

20. The system according to claim 19, wherein the requirements include a specified width and spacing for one or more of the set of tracks, wherein the snapping module is adapted to match the specified width and spacing for one of the set of tracks to a width and location of one of the plurality of shapes of the instance that is placed on the one track, and wherein the specified width for the one track is different than the specified width for another one of the set of tracks, and wherein the specified spacing for the one track is different than the specified spacing for another one of the set of tracks.

* * * * *